United States Patent [19]

Martin et al.

[11] Patent Number: 5,153,457
[45] Date of Patent: Oct. 6, 1992

[54] OUTPUT BUFFER WITH DI/DT AND DV/DT AND TRI-STATE CONTROL

[75] Inventors: Robert C. Martin; Stanley C. Keeney, both of Dallas, Tex.

[73] Assignee: Texas Instruments Incorporated, Dallas, Tex.

[21] Appl. No.: 626,160

[22] Filed: Dec. 12, 1990

[51] Int. Cl.$^5$ .................. H03K 19/092; H03K 17/16
[52] U.S. Cl. .................... 307/443; 307/451; 307/475; 307/473
[58] Field of Search ............ 307/448, 443, 451, 456, 307/475, 473

[56] References Cited

U.S. PATENT DOCUMENTS

| | | | |
|---|---|---|---|
| 4,862,018 | 8/1989 | Taylor et al. | 307/443 |
| 4,933,574 | 6/1974 | Lien et al. | 307/443 |
| 4,959,561 | 9/1990 | McDermott et al. | 307/443 |
| 5,021,684 | 6/1991 | Ahuja et al. | 307/443 |
| 5,023,472 | 6/1991 | Hashimoto et al. | 307/443 |

Primary Examiner—Edward P. Westin
Assistant Examiner—Richard Roseen
Attorney, Agent, or Firm—B. Peter Barndt; Richard L. Donaldson

[57] ABSTRACT

An output buffer (12) is provided for producing an output signal varying between a voltage on a first lien (22) and a voltage on a second line (36). First output circuitry (3, 4) is provided for pulling an output terminal (26) to the voltage on first line (22). Second output circuitry (6, 7) is provided for pulling output terminal (26) to the voltage on second line (36) in response to an input thereto. First feedback circuitry (2, 8) is provided for detecting a voltage spike on first line (22) and varying the input to first output circuitry (3 4) in response. Second feedback circuitry (5, 9) is provided for detecting a voltage spike on second line (36) and varying the input to second output circuitry (6, 7) in response.

24 Claims, 2 Drawing Sheets

OUTPUT BUFFER WITH DI/DT AND DV/DT AND TRI-STATE CONTROL

TECHNICAL FIELD OF THE INVENTION

The present invention relates in general to electronic circuits and in particular, to output buffers.

BACKGROUND OF THE INVENTION

A typical bipolar, CMOS or BiCMOS output buffer has an uncontrolled edge rate (the rate at which the output transitions from a first voltage to a second) that depends primarily on the size of the output driving device and the load being driven. Propagation delays (the time delay between the input of a signal at the input port and the corresponding output at the output port) through on output buffer can vary 4-5 times due to the variations in supply voltage ($V_{CC}$), temperature, process and load. The result is that edge rates are very fast at light loads, strong process, high supply voltage ($V_{CC}$) and low temperature. Conversely, edge rates are slow and propagation delays are extremely long at heavy loads, weak process, low supply voltage ($V_{CC}$) and low temperature. In addition to undesirable variations in propagation delay and edge rates, currently available output buffers may induce noise onto the system ground and voltage supply lines. The fast edge rates cause large voltage spikes on the ground and supply voltage leads because of the high transient current (di/dt) they generate. Consequently, cross-coupling between pins and subsequent logic errors can result especially when large packages are used.

Currently available output buffers control edge rates and transient noise by adding impedance in series with the output devices or turning on the output devices in stages to limit the peak currents. Both of these methods have serious disadvantages in that the output propagation delay is even more sensitive to variations in supply voltage, process temperature and load.

Thus, a need has arisen for an output buffer in which transient noise and edge rates can be controlled. At the same time, the output buffer should compensate for variations in supply voltage process temperature and load.

SUMMARY OF THE INVENTION

According to the present invention, an output buffer is provided which includes a voltage supply line for providing a desired voltage level. Drive control circuitry generates a control signal on a control signal node responsive to an input. Output circuitry pulls an output node towards the voltage level responsive to the control signal. Current transient control circuitry coupled to the drive control circuitry detects a voltage spike on the voltage supply line and varies the control signal responsive thereto.

According to another aspect of the present invention, an output buffer is provided which includes a voltage supply line for providing a desired voltage level. Drive control circuitry generates a control signal on a control signal node responsive to an input. Output circuitry pulls an output node towards the voltage level responsive to the control signal. Edge rate control circuitry is coupled to the drive control circuitry for varying the control signal such that the output signal has a controlled edge rate during a voltage transition on the output node.

The output buffer of the preferred embodiment of the present invention has significant advantages over prior art output buffers. The preferred embodiment has programmable controlled edge rates which may be compensated for variations in temperature, voltage process and load variations. The present invention also has adaptive current transition limiting to prevent excessive noise spikes on the power and ground lines due to high current transition rates in the output drivers. Also provided in the preferred embodiment is an adaptive precharging circuit to reduce the increase in intrinsic delay which normally accompanies any attempt to control edge rates. The present invention allows controlled edge rates of a wide-range of voltage transition rates while at the same time presenting only a very small increase in intrinsic delay or increased delay due to loading. The present invention allows the building of a system which has low noise and more consistent performance over extreme operating conditions.

BRIEF DESCRIPTION OF THE DRAWINGS

For a more and complete understanding of the present invention and the advantages thereof, reference is now made to the following description taken in conjunction with the accompanying drawings in which.

DETAILED DESCRIPTION OF THE INVENTION

Figure 1:
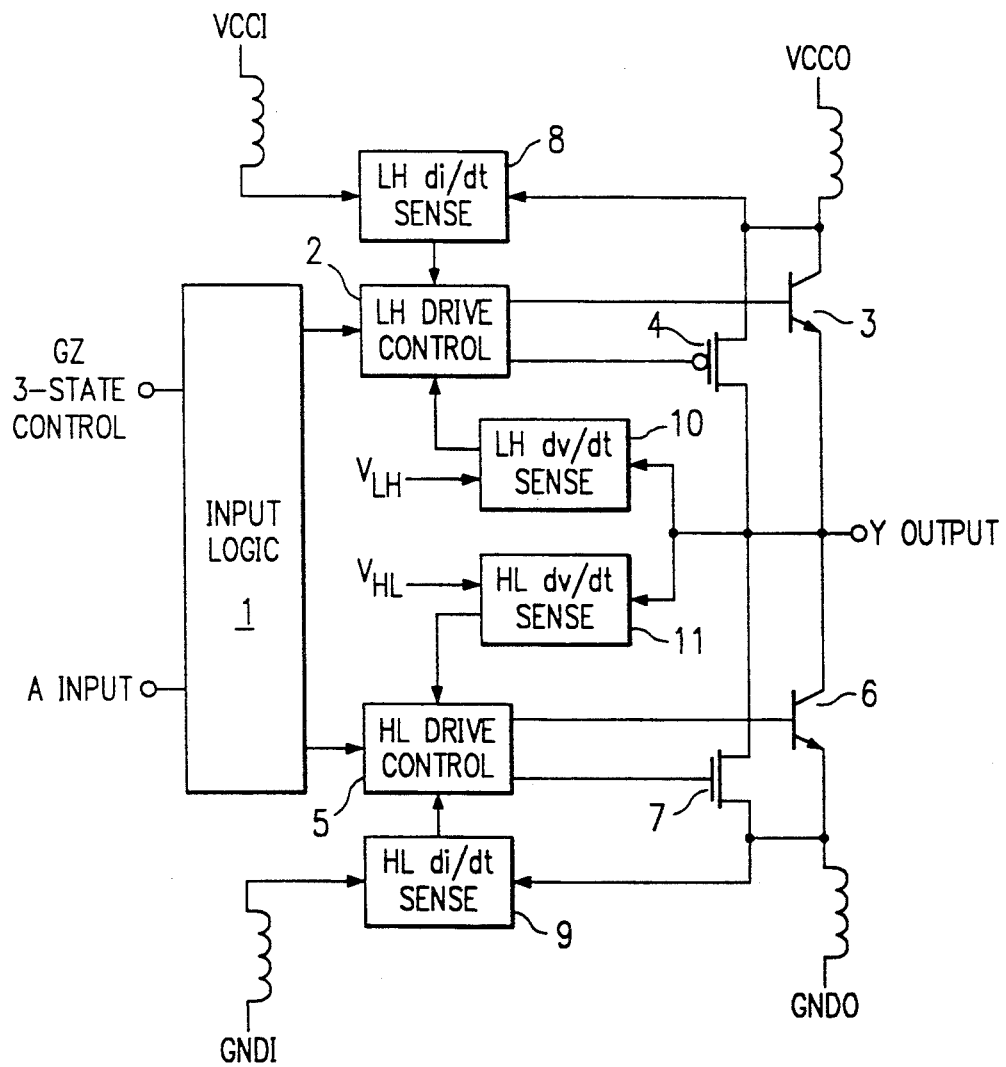
FIG. 1 is a functional block diagram of an output buffer according to the invention.

FIG. 1 depicts the primary components of the output buffer 12 according to the invention. The output buffer drives one or more load devices coupled to buffer output Y between the rails $V_{CC0}$ and $GND_0$ in response to a data signal received at input A of input logic circuitry 1. Input logic circuitry 1 also receives an active low tri-state enable signal on input GZ. In the tri-state mode, the output buffer provides a high impedance to the devices loading it.

The low to high transition, when the output is being driven to the $V_{CC0}$ rail, is controlled by low to high drive control circuitry 2 which varies the gate/base drive to upper drive transistors 3 and 4. The high to low transition, when the output is being driven to the $GND_0$ rail, is controlled by high to low drive control circuitry 5 which varies the gate/base drive to lower drive transistors 6 and 7.

Voltage spikes appearing on the $V_{CC0}$ rail are controlled by a feedback loop comprising low to high current transition (di/dt) sense circuitry 8 and low to high drive control circuitry 2. Sense circuitry 8 operates in conjunction with a second, lightly loaded, voltage supply $V_{CC1}$. Voltage spikes appearing on the $GND_0$ rail are controlled by a feedback loop comprising high to low current transition (di/dt) sense circuitry 9 and high to low drive circuitry 5. Sense circuitry 9 operates in conjunction with a second, lightly loaded, ground $GND_1$.

The low to high edge rate of the signal being output at output Y is controlled by a feedback loop comprised of low to high voltage transition (dv/dt) sense circuitry 10 and low to high drive control circuitry 2. Similarly, the high to low edge rate of the signal being output on output Y is controlled by the feedback loop comprising high to low voltage transition (dv/dt) circuitry 11 and high to low drive control circuitry 5.

Figure 2:
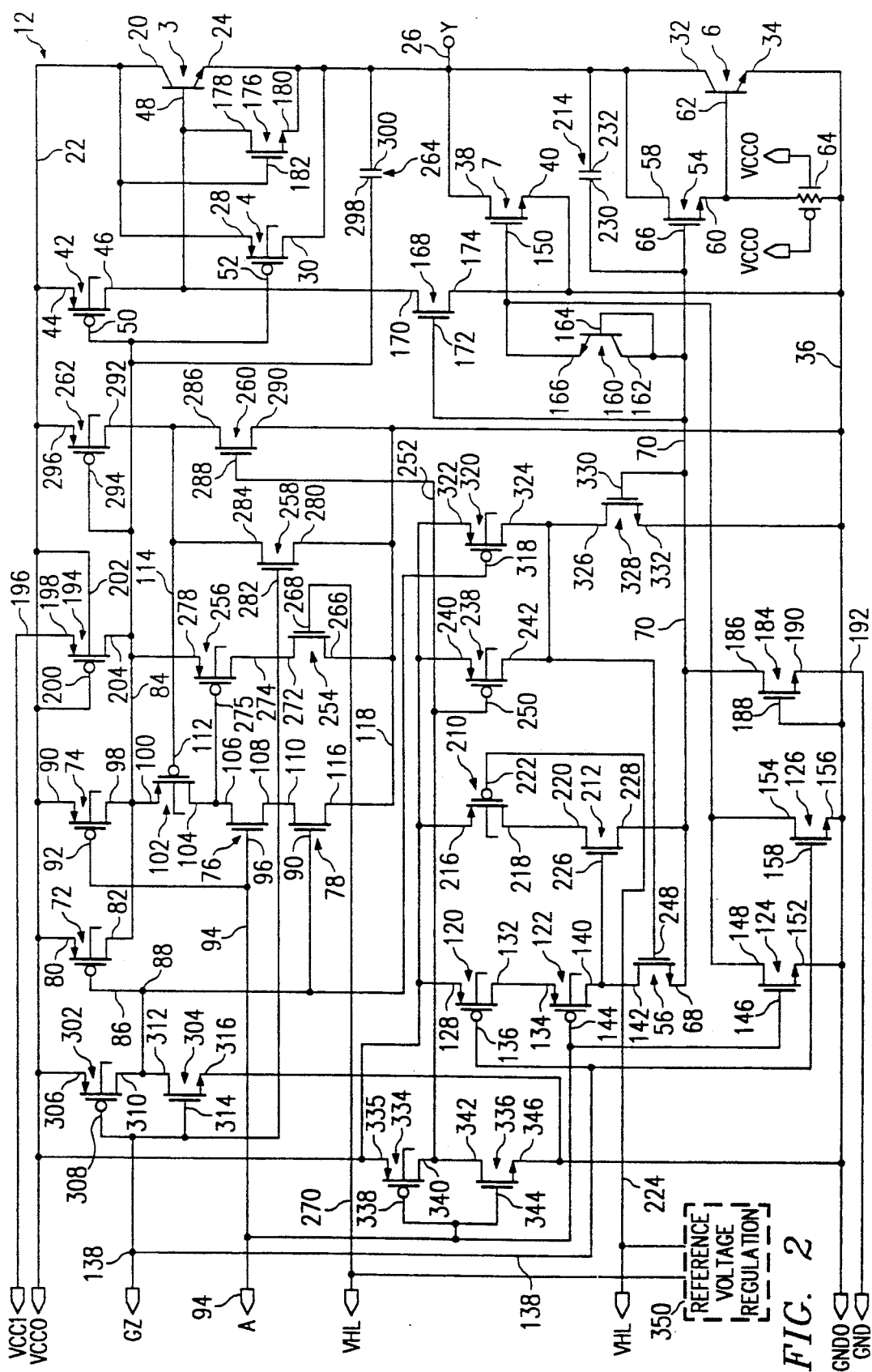
FIG. 2 is an electrical schematic of a preferred embodiment of the output buffer of FIG. 1.

Referring to FIG. 2, an adaptive BiCMOS output buffer 12 according to the preferred embodiment is schematically depicted. The basic output circuitry includes upper output transistors 3 and 4 and lower output transistors 6 an 7. Transistor 3 comprises an NPN bipolar transistor having its collector 20 coupled to supply a voltage $V_{CC0}$ line 22. The emitter 24 of transistor 3 is coupled to output terminal 26 (output Y) of output buffer 12. Transistor 4 is a p channel field effect transistor having its source 28 coupled to $V_{CC0}$ supply line 22 and its drain 30 coupled to output terminal 26.

Transistor 6 comprises an NPN bipolar transistor having its collector 32 coupled to output terminal 26 and its emitter 34 coupled to $GND_0$ line 36. Transistor 7 comprises an n channel field effect transistor having its drain 38 coupled to output 26 and its source 40 coupled to GND0 line 36.

Transistor 42, which comprises a p channel field effect transistor, providing base drive for upper output transistor 3. The source 44 of transistor 42 is coupled to $V_{CC0}$ line 22 while drain 46 of transistor 42 is coupled to the base 48 of transistor 3. The gate 50 of transistor 42 is coupled to the gate 52 of transistor 4. Transistors 54 and 56 provide base/gate drive to transistors 6 and 7. The drain 58 of transistor 54 is coupled to output terminal 26 while the source 60 is coupled to base 62 of transistor 6 and to ground line 36 through a resistor 64. The gate 66 of transistor 54 is coupled to source 68 of transistor 56 at node 70.

Transistors 3 and 4 are coupled through transistor 42 to a NAND gate comprising transistors 72, 74, 76 and 78. Transistor 72 is a p channel field effect transistor having a source 80 connected to $V_{CC0}$ line 22. The drain 82 is coupled to gate 50 of transistor 42 at node 84. Gate 86 of transistor 72 is connected at node 88 to gate 90 of transistor 78. Transistor 74 is also a p channel field effect transistor having its source 90 coupled to $V_{CC0}$ line 22. Gate 92 of transistor 74 is coupled to node 94 (input A) which is also connected to gate 96 of transistor 76. Drain 98 of transistor 74 is coupled to source 100 of p channel transistor 102 at node 84. The drain 104 of transistor 102 is coupled to the drain 106 of transistor 76. The source 108 of transistor 76 is coupled to the drain 110 of transistor 78. Gate 112 of transistor 102 is coupled to node 114 while drain 116 of transistor 78 is coupled node 118 completing the NAND gate.

Lower output transistors 6 and 7 are coupled through transistors 54 and 56 to a NOR gate comprising transistors 120, 122, 124 and 126. Transistors 120 and 122 are p channel field effect transistors while transistor 124 and 126 are n channel field effect transistors. The source 128 of transistor 120 is coupled to $V_{CC0}$ while the drain 132 of transistor 120 is coupled to source 134 of transistor 122. Gate 136 of transistor 120 is coupled to GZ input terminal 138. The drain 140 of transistor 122 is coupled to the drain 142 of transistor 56. Gate 144 of transistor 122 is coupled to input A terminal 94 and to gate 146 of transistor 124. The drain 148 of transistor 124 is coupled to the gate 150 of transistor 7. The source 152 of transistor 124 is coupled to GND0 line 36. Similarly, drain 154 of transistor 126 is coupled to gate 150 of transistor 7 while source 156 of transistor 126 is coupled GND0 line 36. Gate 158 of transistor 126 is coupled to input GZ terminal 138 completing the NOR gate.

A diode is formed by a transistor 160 having its collector 162 tied to its base 164. The base is also coupled to node 70. The emitter 166 is coupled to gate 150 of transistor 7 along with the NOR gate. A turnoff transistor 168, which is a field effect transistor has its drain 170 coupled to the drain 46 of transistor 42 and base 48 of transistor 3. Source 174 of transistor 168 is coupled to drain 40 of transistor 7 and $GND_0$ line 36. A second turnoff transistor 176, which is an n channel field effect transistor, is connected across base to emitter at transistor 3. The drain 178 is coupled to base 48 of transistor 3. The source 180 of transistor 176 is coupled to output terminal 26 while gate 182 is coupled to $V_{CC0}$ line 22.

Transistor 184 performs the function of limiting the change in current with time (di/dt) on the high-low output voltage transition. Transistor 184 is an n channel field effect transistor having its drain 186 coupled to node 70. The gate 188 is coupled to $GND_0$ line 36 while the source 190 is coupled to $GND_1$ line 192. A similar transistor 194, which is a p channel transistor, limits the change with current with time (di/dt) on the high to low transition. Source 198 of transistor 194 is coupled to $V_{CC1}$ line 196. Gate 200 and tank 202 of transistor 194 are each coupled to $V_{CC0}$ line 22. The drain 204 of transistor 194 is coupled to node 84. Low to high edge rate control circuitry includes transistor 210, which is a p channel effect transistor, transistor 212, which is an n channel field effect transistor and capacitor 214. Source 216 is coupled to $V_{CC0}$ while the drain 218 of transistor 210 is coupled to the drain 220 of transistor 212. The gate 222 of transistor 210 is coupled to a high to low reference voltage line 224. The gate 226 of transistor 212 is coupled to drain 140 of transistor 122 and drain 142 of transistor 56. Source 228 of transistor 212 is coupled to node 70 and in-turn, to the first plate 230 of capacitor 214. The second plate 232 of capacitor 214 is coupled to output terminal 26.

A transistor 238 enables transistor 56 during a high to low transition to speed up the voltage transitions on node 70. Transistor 238 is a p channel field effect transistor having its source 240 tied to $V_{CC0}$ line 22 and its drain 242 tied to the gate 248 of transistor 56. The gate 250 is tied to inverted input node 252.

Low to high edge rate control circuitry includes transistors 254, 256, 258, 260 and 262, and capacitor 264. Transistor 254 is an field effect transistor having its source 266 coupled to $GND_0$ line 36. The gate 268 of transistor 254 is coupled to low to high reference voltage line 270. The drain 272 of transistor 254 is coupled to the drain 274 of transistor 256. Transistor 256 is a p channel field effect transistor, having its gate 275 coupled to the respective drains 104 and 106 of transistors 102 and 76. The source 278 of transistor 256 is coupled to node 84. Transistor 258 is a field effect transistor having its source 280 coupled to $GND_0$ line 36. Gate 282 of transistor 258 is coupled to GZ input line 138. Drain 284 is coupled at node 114 to gate 112 of transistor 102. Transistor 260 is a field effect transistor having its drain 286 also coupled to node 114. The gate 288 is coupled to inverted input line 252 while the source 290 of transistor 260 is coupled to $GND_0$ line 36. Transistor 262 is a p channel device having its drain 292 coupled to node 114, its gate 294 coupled to node 84 and its source 296 coupled to $V_{CC0}$ line 22. Finally, the first plate 298 of capacitor 264 is coupled to node 84 and the second plate 300 of capacitor 264 is coupled to output terminal 26.

Transistors 302 and 304 form an inverter coupled to GZ input terminal 138. Transistor 302 is a p channel field effect transistor having its source 306 coupled to $V_{CC0}$ line 22. Gate 308 of transistor 302 is coupled GZ input line 138 and drain 310 is coupled to drain 312 of transistor 304. Transistor 304 is an n channel field effect transistor having its gate 314 connected to GZ input terminal 138. The source 316 of transistor 304 is coupled to GND$_0$ line 36. Drain 310 of transistor 302 and drain 312 of transistor 304 are coupled to node 88 as well as to gate 318 of transistor 320. Transistor 320 is a p channel field effect transistor having its source 322 coupled to V$_{CC0}$ line 22. The drain 324 of transistor 320 is coupled to drain 222 of transistor 238 and drain 326 of transistor 328. Transistor 328 is an n channel field effect transistor its gate 330 tied to node 70 and its source 332 tied to GND$_0$ line 36.

Transistors 334 and 336 invert input A. Transistor 334 is a p channel field effect transistor having its source 335 tied to V$_{CC0}$ line 22, its gate 338 coupled to input A terminal 94 and its drain 340 coupled to drain 342 of transistor 336. Transistor 336 is an n channel field effect transistor having its gate 344 coupled to input A terminal 94 and its source 346 coupled to GND$_0$ line 36. Drain 340 of transistor 334 and drain 342 of transistor 336 are coupled to gate 250 of transistor 238 and gate 288 of transistor 260.

The operation of the output buffer circuit depicted in FIGS. 1 and 2, can now be described in detail. The output buffer of the present invention is a tri-state, non-inverting output buffer, which in the preferred embodiment is implemented as a BiCMOS circuit. It is important to note, however, that the present circuit can be also implemented using CMOS or TTL circuitry. Input A receives data while the GZ input controls the tri-state operation of the output buffer.

Data input on input A is inverted by the inverter made up of transistors 334 and 336. Similarly, active low tri-state enable signal GZ is inverted by transistors 302 and 304. The NAND gate made up of transistors 72, 74, 76 and 78 performs the logic necessary to turn upper output transistors 3 and 4 off in the tri-state mode. The NOR gate made up of transistors 120, 122, 124 and 126 performs the logic necessary to turn off lower output transistors 6 and 7 in the tri-state mode.

When the data applied at input A goes to a high state (a logic "1") transistor 42 drives the base 48 of transistor 3 until the output at output terminal 26 reaches a voltage of V$_{CC0}$ less the base emitter voltage drop (V$_{be}$) of transistor 3 (V$_{CC0}$−V$_{be}$), at which time transistor 3 shuts off. Output 26 is then pulled to the voltage V$_{CC0}$ by output transistor 4. In a similar fashion, when the input applied to gate input A goes low, transistor 54 drives the base 62 of transistor 6 until the output voltage at output terminal 26 reaches a voltage of GND$_0$ plus the base emitter voltage (V$_{be}$) of transistor 6 (GND$_0$+V$_{be}$), and then turns off preventing the saturation of transistor 6. Output transistor 7 then pulls the voltage at output terminal 26 all the way to ground such that the output voltage meets the output low voltage (V$_{ol}$) required for interfacing with the devices loading output buffer 12.

The diode formed by transistor 160 coupled to the gate of transistor 7 causes both transistor 6 and 7 to turn on at about the same threshold so that they share the load during the slewing of the output voltage; otherwise only transistor 7 would turn on at slower edge rates causing more variability in the high-low transition of the output voltage during worse case conditions. Resistor 64 is the turnoff device for transistor 6. Transistors 168 and 176 are the turnoff devices for transistor 3. In the tri-state mode, transistor 168 and 42 are turned off allowing the base 48 of transistor 3 to float disabling the output. Transistor 176 shorts base 48 and emitter 24 of transistor to limit bus loading by transistor 3 in the tri-state mode.

Transitory current limiting (di/dt) on the high-low output voltage transition is performed by transistor 184. Limiting transitory currents reduces voltage spikes on the ground and supply voltage lines and reduces crosstalk. Gate 188 of transistor 184 is coupled to the "dirty" ground GND$_0$ which carries the heavy output current while the source 190 is coupled to a second, lightly loaded ground GND$_1$. The voltage across the inductance of GND0 line 36 is proportional to the change in current with time (di/dt) of the current through transistor 6 during output slewing and appears as a gate to source voltage which turns on transistor 184 once it reaches the threshold of transistor 184, which is typically around 1.2 volts. When transistor 184 turns on, it pulls node 70 lower, thereby reducing the current supplied to the base 62 of transistor 6. This limits the transitory voltage di/dt and the voltage spike across the inductance of GND$_0$ line 36.

In simultaneous switching situation, when multiple devices are switching at output terminal 26, transistor 184 controls the high-low edge rate adaptively, depending on the ground lead inductance and the number of devices switching simultaneously at the output terminal 26, which keeps noise spikes on the output ground within acceptable limits, typically less than 1.5 volts. If the package inductance is acceptable, and the number of output loads switching is not enough to produce a voltage spike sufficient to turn on transistor 184, there is no effect on the output edge rate. In this situation, the circuit has accurate transient current (di/dt) limiting available, and there is no performance penalty unless the (di/dt) limiting is needed because of excessive noise spikes on GND$_0$ line 36. Using previous methods of limiting, a sometimes large penalty was paid in performance whether or not such limiting was needed.

In a similar fashion, transistor 194 limits transitory current created noise on V$_{CC0}$ line 22. The source 198 is coupled to the lightly loaded V$_{CC1}$ line 196. Transistor 194 senses transient current (di/dt) noise on V$_{CC0}$ line 22 and in response reduces the drive to transistor 42 and thus to output transistors 3 and 4.

Edge rate control is accomplished based on the principal that a constant change in voltage with time (dv/dt) appears across a capacitor which is charged by a constant current and that this change in voltage with time (dv/dt) is proportional to the magnitude of the charging current. Gate 222 of transistor 210 is tied to a reference voltage V$_{hl}$ by line 224 which sets the current to control to high-low edge rate. Transistor 212 gates the current through transistor 210 to node 70 only when the output voltage at output terminal 26 is to be driven to the low logic state. During the high-low slewing of the output voltage, node 70 is pulled high by the current through transistor 210. Once the output begins to slew low, most of the current is used to charge capacitor 214 connected between node 70 and output terminal 26. If the output voltage at output terminal 26 tries to slew faster than the current can charge capacitor 214, then the voltage across capacitor 214 forces the voltage node 70 lower, which turns off transistor 54 reducing the slew rate at output terminal 26.

The edge rate of the output voltage appearing at output terminal 26 is proportional to the current set by transistor 210 and inversely proportional to the value of capacitor 214. If the voltage at the gate 222 of transistor 210 is constant, then the current set by transistor 210 will vary with temperature, supply voltage $V_{CC}$ and process. Additionally, the transfer characteristics of transistors 7, 6 and 54 will vary. A significant improvement in performance can be achieved by applying a reference voltage $V_{hl}$ at terminal 224 which has the characteristics of: (1) increasing as supply voltage $V_{CC}$ decreases; (2) increases with weak process; and (3) increases with temperature. This is provided by optional reference voltage regulation circuitry 350.

The edge rate can be set by three methods: (1) changing the size of transistor 210 to change the reference; (2) changing the size of capacitor 214; or (3) changing the reference voltage $V_{hl}$.

If node 70 is only charged by the current flowing through transistor 210, which may be less than 100 micro amperes at slow edge rates, then an excessive intrinsic delay occurs while mode 70 is charged to a voltage equal to the emitter-base voltage $V_{be}$ of transistor 6 plus the threshold voltage of transistor 54 before transistor 6 begins to turn on. This disadvantage is solved by an adaptive speed-up circuit that can drive node 70 rapidly to the turn-o threshold and then turn off. Transistor 56 is the speed-up device for the high-low edge. While the output voltage appearing at output terminal 26 is high, gate 248 of transistor 56 is held high by transistor 238, the gate 240 of which is being driven by the inverse of the input signal appearing at input terminal A. When input A goes low requiring a high-low transition at output terminal 26, transistor 238 turns off and transistors 120 and 122 turn on. A high current, supplied through transistors 120, 122 and 56 pull node 70 high rapidly. Transistor 328 mirrors transistor 54 such that when transistor 54 begins to turn on, current flows in transistor 328 reducing the drive to gate 248 of transistor 56 thereby turning off transistor 56. Node 70 has therefore been rapidly charged to the turn-on threshold of output transistors 6 and 7. At this point, the current in transistor 210 and the value of capacitor 214 control the transition from high to low at output terminal 26.

Transistor 320 pulls gate 248 of transistor 56 high in the tri-state mode in preparation for a high-low transition from tri-state. The circuit reduces the intrinsic delay by as much as 4 or 5 ns at edge rates less than 1.5 v/ns.

In similar manner, the low-high edge rate is controlled with transistor 254 setting the charging current and transistor 256 switching the charging current. The gate 268 of transistor 254 in this case is coupled to a low to high reference voltage $V_{lh}$ by line 270. As with reference voltage $V_{hl}$, reference voltage $V_{lh}$ can be a voltage controlled to compensate for varying supply voltage, process and temperature by optional reference voltage regulation circuitry 350. Capacitor 264 is the analog of capacitor 214, and senses the output slew rate. Transistor 102 is the speed-up device and is driven by transistors 258 and 260. Transistor 262 mirrors the current in transistor 4 to shut-off the speed-up circuitry, in a manner similar to that discussed above.

By taking the reference voltage lines 224 and 270 to an external pin, the edge rate of the output buffer of the present invention can be externally programmed. For example, the edge rate characteristics could be controlled from the driven circuit. Even if the small quiescent current in the reference is undesirable, the gates of the current source transistors 210 and 254 could be tied to $GND_0$ and $V_{CC0}$, respectively, eliminating all quiescent current, but still giving a controlled edge rate, even though it would not be compensated for $V_{CC}$, temperature and process variations. By switching the gates of two current source transistors of different sizes connected in parallel, the edge rates can be changed during operation using a logic signal. Further, since each edge (low-high and high-low) is controlled independently, it is possible to have one fast edge and one slow edge.

While preferred embodiments of the invention and their advantages have been set forth in the above-detailed description, the invention is not limited thereto, but only by the scope and spirit of the appended claims.

What is claimed is:

1. An output buffer comprising:
    a voltage supply line for providing a desired voltage level;
    drive control circuitry coupled to the voltage supply line for generating a control signal on a control signal node responsive to an input;
    output circuitry for pulling an output node towards said voltage level responsive to said control signal;
    current transient control circuitry coupled to said drive control circuitry for detecting a voltage spike on said voltage supply line and varying the control signal responsive thereto; and
    edge and rate control circuitry coupled to said drive control circuitry for varying said control signal such that said output signal has a controlled edge rate during a voltage transition on said output node.

2. The output buffer of claim 1, wherein drive control circuitry comprises a transistor connected between the voltage supply line and the control signal node responsive to said input.

3. The output buffer of claim 2, wherein said transistor comprises a first transistor and wherein said current transient control circuitry comprises a second transistor enabled by a voltage transient on said voltage supply line and operable to drive said first transistor to adjust said control signal in response to said voltage transient.

4. The output buffer of claim 3, wherein said first transistor comprises a p channel transistor having a source coupled to said voltage supply line and a drain coupled to said control signal node.

5. The output buffer of claim 1, wherein said voltage level is a positive voltage level and said second transistor comprises a p channel transistor having a gate coupled to said voltage supply line, a source coupled to a second voltage supply line, and a drain coupled to the gate of said first transistor.

6. An output buffer comprising:
    a voltage supply line for providing a desired voltage level;
    drive control circuitry coupled to the voltage supply for generating a control signal on a control signal node responsive to an input;
    output circuitry for pulling an output node towards said voltage level responsive to said control signal; and
    edge rate control circuitry coupled to said drive control circuitry and to the output node for varying said control signal such that said output signal has a controlled edge rate during a voltage transition on said output node.

7. The output buffer of claim 6, wherein said edge rate control circuitry comprises:
    a capacitor coupling said drive control circuitry with said output node for controlling the voltage transition of said output signal as a function of a current provided to said capacitor; and circuitry for selectively providing said current as a function of a reference voltage.

8. The output buffer of claim 7, wherein said circuitry for selectively providing said current comprises a first transistor for setting said current as a function of said reference voltage and a second transistor for switching said current to said capacitor.

9. The output buffer of claim 8, wherein said drive control circuitry comprises a transistor connected between the voltage supply line and the control signal node responsive to said input.

10. An output buffer comprising:
a tri-state enable input terminal;
a data input terminal;
a first voltage supply line;
a second voltage supply line;
a first ground line;
a second ground line;
input logic circuitry having a first input coupled to said tri-state enable terminal and a second input coupled to said data input terminal;
low to high drive control circuitry coupled to said input logic circuitry;
high to low drive control circuitry coupled to said input logic circuitry;
low to high voltage transition sense circuitry coupled to a low to high reference voltage, said output terminal and said low to high drive control circuitry;
high to low voltage transition sense circuitry coupled to a high to low reference voltage said output terminal and an output coupled to said high to low drive control circuitry;
low to high current transition sense circuitry coupled to said first voltage supply voltage line, to a second supply voltage line and said low to high drive control circuitry;
high to low current transition sense circuitry coupled to said first ground line, said second ground line and said high to low drive control circuitry;
upper output drive circuitry coupled to said low to high drive control circuitry, said second supply voltage line and said output terminal; and
lower output drive circuitry coupled to said high to low drive control circuitry, said second ground line and said output terminal.

11. The output buffer of claim 10 wherein said upper output drive circuitry comprises:
a bipolar transistor having a collector coupled to said second supply voltage line, a base coupled to low to high drive control circuitry and an emitter coupled to said output terminal; and
a field effect transistor having one of its source or drain coupled to said second supply voltage line, a gate coupled to low to high drive control circuitry and another one of its source or drain coupled to said output terminal.

12. The output buffer of claim 11, wherein said lower output drive circuitry comprises:
a bipolar transistor having a collector coupled to said output terminal, a base coupled to said high to low drive control circuitry and an emitter coupled to said second ground line; and
a field effect transistor having one of its source or drain coupled to said output terminal, a gate coupled to said high to low drive control circuitry and another one of its source or drain coupled to said second ground line.

13. The output buffer of claim 12, wherein said high to low drive control circuitry includes a high to low drive field effect transistor having one of its source or drain coupled to said output terminal, a gate coupled to said input logic circuitry and another one of its source or drain coupled to said base of said bipolar transistor of said lower output drive circuitry.

14. The output buffer of claim 13, wherein said high to low current transition sense circuitry comprises a sensing field effect transistor having one of its source or drain coupled to said gate of said drive field effect transistor, a gate coupled to said drive field effect transistor, a gate coupled to said second ground line and another one of its source or drain region coupled to said first ground line.

15. The output buffer of claim 11, wherein said low to high drive control circuitry includes a low to high drive field effect transistor having one of its source or drain coupled to said second supply voltage line, a gate coupled to said input logic circuitry and another one of its source or drain coupled to said base of said bipolar transistor of said upper output drive circuitry.

16. The output buffer of claim 15, wherein said low to high current transition sense circuitry comprises a sensing field effect transistor having one of its source or drain coupled to said first supply voltage line, a gate coupled to said second supply voltage line and another one of its source or drain coupled to said base of said drive field effect transistor.

17. The output buffer of claim 10, wherein said high to low voltage transition circuitry comprises:
a current setting field effect transistor having one of its source or drain coupled to said second supply voltage line and a gate coupled to a said high to low reference voltage;
a gating field effect transistor having one of its source or drain coupled to another one of the source or drain of said current setting transistor, and a gate coupled to said input logic circuitry; and
a capacitor having a first plate coupled to another one of the source or drain of said gating transistor and a second plate coupled to said output terminal.

18. The output buffer of claim 10, wherein said low to high voltage transition sense circuitry comprises:
a current setting field effect transistor having one of its source or drain coupled to said second ground line and a gate coupled to said low to high reference voltage;
a gating field effect transistor having one of its source or drain coupled to another one of the source or drain of said current setting transistor and a gate coupled to said logic input circuitry; and
a capacitor having a first plate coupled to the other one of the source or drain of said gating transistor and a second plate coupled to said output terminal.

19. The output buffer of claim 17, and further comprising high to low transition speed up circuitry including:
a first speed-up field effect transistor having one of its source or drain switchably coupled to said second voltage supply line through said input logic circuitry and another one of its source or drain coupled to said gate of said high to low drive field effect transistor;
a second speed-up field effect transistor having one of its source or drain coupled to said gate of said second supply voltage line, a gate coupled to said input logic circuitry and another one of its source or drain coupled to a gate of said first speed up field effect transistor; and a shut-off field effect transistor having one of its source or drain coupled to a gate of said first speed up transistor, a gate coupled to said gate of said high to low drive field effect transistor and another one of its source or drain coupled to said second ground line.

20. The output buffer of claim 18, and further comprising low to high transition speed up circuitry including:

a first speed-up field effect transistor having one of its source or drain switchably coupled to said second groundline through said input logic circuitry and another one of its source or drain coupled to said gate of said low to high drive field effect transistor;

a second speed-up field effect transistor having one of its source or drain coupled to a gate of said first speed up transistor, a gate coupled to said input logic circuitry and another one of its source or drain coupled to said second ground; and a shut-off field effect transistor having one of its source or drain coupled to said second voltage supply line, a gate coupled to said another one of the source or drain of said first speed up transistor and said gate of said low to high drive transistor and another one of its source or drain coupled to said gate of said first speed up transistor.

21. An output buffer comprising:

a first voltage supply line for providing a first desired voltage level;

a second voltage supply line for providing a second desired voltage level;

first drive control circuitry coupled to the first voltage supply for generating a first control signal on a first control signal node responsive to a first input;

second drive control circuitry for generating a second control signal on a second control signal node responsive to a second input;

first output circuitry for pulling an output node towards said first desired voltage level responsive to said first control signal;

second output circuitry for pulling said output node towards said second voltage level responsive to said second control signal;

first transient control circuitry coupled to said first drive control circuitry for detecting a voltage spike on said first voltage supply line and varying the first control signal responsive thereto;

second current transient control circuitry coupled to said second drive control circuitry for detecting a voltage spike on said second supply line and varying the second control signal responsive thereto;

first edge rate control circuitry coupled to said first drive control circuitry for varying said first control signal such that said output signal has a controlled edge rate during a voltage transition on said output node towards said first voltage level; and second edge rate control circuitry coupled to said second drive control circuitry for varying said second control signal such that said output signal has a controlled edge rate during a voltage transition on said output node towards said second voltage level.

22. A method of driving an output load comprising the steps of:

providing a desired voltage level on a voltage supply line;

generating a control signal on a control signal node responsive to an input;

pulling an output node towards the voltage level on the voltage supply line responsive to the control signal;

detecting a voltage spike on the voltage supply line and varying the control signal responsive thereto; and varying the control signal such that the output signal has a controlled edge rate during a voltage transition on the output node.

23. The method of claim 22, wherein said step of detecting a voltage spike on the voltage supply line comprises the step of enabling a transistor responsive to a voltage transient on the voltage supply line to vary the control signal.

24. The method of claim 23, wherein said step of varying the control signal such that the output signal has a controlled edge comprises the steps of:

charging a capacitor to control the voltage transition of the output signal as a function of current provided to the capacitor; and selectively providing current to the capacitor as a function of a reference voltage.

* * * * *